United States Patent
Wilby et al.

(10) Patent No.: US 9,903,750 B2
(45) Date of Patent: Feb. 27, 2018

(54) METHOD AND DEVICE FOR DETERMINING INFORMATION RELATING TO THE MASS OF A SEMICONDUCTOR WAFER

(71) Applicant: METRYX LIMITED, Bristol (GB)

(72) Inventors: Robert John Wilby, Bristol (GB); Adrian Kiermasz, Bristol (GB)

(73) Assignee: METRYX LTD., Bristol (GB)

( * ) Notice: Subject to any disclaimer, the term of this patent is extended or adjusted under 35 U.S.C. 154(b) by 0 days.

(21) Appl. No.: 14/911,499

(22) PCT Filed: Aug. 21, 2014

(86) PCT No.: PCT/GB2014/052573
§ 371 (c)(1),
(2) Date: Feb. 11, 2016

(87) PCT Pub. No.: WO2015/033108
PCT Pub. Date: Mar. 12, 2015

(65) Prior Publication Data
US 2016/0195424 A1   Jul. 7, 2016

(30) Foreign Application Priority Data
Sep. 4, 2013   (GB) .................................. 1315715.1

(51) Int. Cl.
*G01G 3/16* (2006.01)
*G01G 19/00* (2006.01)
(Continued)

(52) U.S. Cl.
CPC ....... *G01G 19/00* (2013.01); *H01L 21/67253* (2013.01); *B06B 1/06* (2013.01);
(Continued)

(58) Field of Classification Search
CPC ....................................................... G01G 3/16
(Continued)

(56) References Cited

U.S. PATENT DOCUMENTS

| 4,156,361 A | 5/1979 | Melcher et al. |
| 5,625,170 A | 4/1997 | Poris |

(Continued)

FOREIGN PATENT DOCUMENTS

| JP | H05149780 A | 6/1993 |
| JP | H10-038665 A | 2/1998 |

(Continued)

OTHER PUBLICATIONS

Written Opinion, International Searching Authority, PCT/GB2014/052573, dated Oct. 11, 2014, 4 pages.*

(Continued)

*Primary Examiner* — Clayton E Laballe
*Assistant Examiner* — Kevin Butler
(74) *Attorney, Agent, or Firm* — Buchanan Ingersoll & Rooney PC

(57) ABSTRACT

A method of determining information relating to the mass of a semiconductor wafer is disclosed. The method comprises loading the semiconductor wafer on to a measurement area of a weighing device having weight compensation means arranged to compensate for a predetermined weight loaded on to the measurement area; generating measurement output indicative of a difference between the weight of the semiconductor wafer and the predetermined weight; and using the measurement output to determine information relating to the mass of the semiconductor wafer. Also discloses is a corresponding weighing device for determining information relating to the mass of a semiconductor wafer.

31 Claims, 6 Drawing Sheets

(51) Int. Cl.
*H01L 21/67* (2006.01)
*B06B 1/06* (2006.01)
*G01H 11/08* (2006.01)
*G01G 17/02* (2006.01)

(52) U.S. Cl.
CPC .............. *B06B 1/0648* (2013.01); *G01G 3/16* (2013.01); *G01G 17/02* (2013.01); *G01H 11/08* (2013.01)

(58) Field of Classification Search
USPC .......................................................... 73/865
See application file for complete search history.

(56) References Cited

U.S. PATENT DOCUMENTS

| | | | | |
|---|---|---|---|---|
| 8,173,283 | B2* | 5/2012 | Furukawa | C04B 35/111 428/64.1 |
| 2008/0087106 | A1* | 4/2008 | Wilby | G01G 19/00 73/862.381 |
| 2009/0090564 | A1 | 4/2009 | Kresina | |
| 2010/0206098 | A1* | 8/2010 | Wilby | G01G 9/00 73/865 |
| 2016/0195424 | A1* | 7/2016 | Wilby | G01G 19/00 73/865 |

FOREIGN PATENT DOCUMENTS

| | | | | |
|---|---|---|---|---|
| JP | 2005114599 A | | 4/2005 | |
| JP | 2010540952 A | | 12/2010 | |
| JP | 2013 088393 | | 5/2013 | |
| JP | 2013088393 | * | 5/2013 | .............. G01G 1/18 |
| WO | WO2009044121 | * | 9/2008 | .............. G01G 9/00 |
| WO | WO 2009/044113 | | 4/2009 | |
| WO | WO 2009/044121 | | 4/2009 | |

OTHER PUBLICATIONS

Search Report, International Searching Authority, PCT/GB2014/052573, dated Oct. 11, 2014, 4 pages.*
Written Opinion of the Intellectual Property Office of Singapore in corresponding Singapore Application No. 11201601091P, 5 pages.
Office Action issued in corresponding Japanese Patent Application No. 2016-539630, 15 pages with English translation.

* cited by examiner

METHOD AND DEVICE FOR DETERMINING INFORMATION RELATING TO THE MASS OF A SEMICONDUCTOR WAFER

CROSS-REFERENCE TO RELATED APPLICATIONS

This application is a U.S. National Stage Application under 35 U.S.C. § 371 of International Patent Application No. PCT/GB2014/052573, filed Aug. 21, 2014 which claims priority to Great Britain Patent Application No. 1315715.1, filed Sep. 4, 2013, the contents of which are hereby incorporated by reference in their respective entireties.

FIELD OF THE INVENTION

The present invention relates to a method of determining information relating to the mass of a semiconductor wafer, for example the mass of the semiconductor wafer or a change in the mass of the semiconductor wafer.

The present invention also relates to a weighing device for determining information relating to the mass of a semiconductor wafer.

BACKGROUND OF THE INVENTION

Microelectronic devices are fabricated on semiconductor (e.g. silicon) wafers using a variety of techniques, e.g. including deposition techniques (CVD, PECVD, PVD, etc.) and removal techniques (e.g. chemical etching, CMP, etc.). Semiconductor wafers may be further treated in ways that alter their mass, e.g. by cleaning, ion implantation, lithography and the like.

Depending on the device being manufactured, each semiconductor wafer may be passed sequentially through hundreds of different processing steps to build up and/or to remove the layers and materials necessary for its ultimate operation. In effect, each semiconductor wafer is passed down a production line. The nature of semiconductor manufacturing means that certain processing steps or sequences of steps in the production flow may be repeated in a similar or identical fashion. For example, this may be to build up similar layers of metal conductors to interconnect different parts of the active circuitry.

To ensure consistency and interoperability of semiconductor equipment used in different factories, standards are adopted throughout the majority of the semiconductor manufacturing industry. For example, standards developed by Semiconductor Equipment and Materials International (SEMI) have a high degree of market uptake. One example of standardisation is the size and shape of the semiconductor (silicon) wafers: typically for volume production they are discs having a diameter of 300 mm. However, some semiconductor (silicon) wafers (typically used in older factories) are discs having a diameter of 200 mm.

The cost and complexity of the processing steps required to produce a completed silicon wafer together with the time that it takes to reach the end of the production line where its operation can be properly assessed has led to a desire to monitor the operation of the equipment on the production line and the quality of the wafers being processed throughout processing, so that confidence in the performance and yield of the final wafers may be assured.

Wafer treatment techniques typically cause a change in mass at or on the surface of the semiconductor wafer. The configuration of the changes to the surface are often vital to the functioning of the device, so it is desirable for quality control purposes to assess wafers during production in order to determine whether they have the correct configuration.

Specialist metrology tools may be used within the production flow so that monitoring is conducted soon after the relevant process of interest and usually before any subsequent processing, i.e. between processing steps.

Measuring the change in mass of a wafer either side of a processing step is an attractive method for implementing product wafer metrology. It is relatively low cost, high speed and can accommodate different wafer circuitry patterns automatically. In addition, it can often provide results of higher accuracy than alternative techniques. For example, on many typical materials, thicknesses of material layers can be resolved down to an atomic scale. The wafer in question is weighed before and after the processing step of interest. The change in mass is correlated to the performance of the production equipment and/or the desired properties of the wafer.

Processing steps carried out on semiconductor wafers can cause very small changes in the mass of the semiconductor wafer, which it may be desirable to measure with a high accuracy/sensitivity. For example, removing a small amount of material from the surface of the semiconductor wafer may reduce the mass of the semiconductor wafer by a few milligrams and it may be desirable to measure this change with an accuracy of the order of ±100 µg or better. Conventional semiconductor wafer metrology methods and devices that rely on measuring the mass or the change in mass of a semiconductor wafer generally only have an accuracy of the order of ±100 µg under normal operating conditions. This accuracy may be insufficient for very high sensitivity measurements of mass changes, or for measurements of very small mass changes, e.g. a mass change due to ion implantation. In addition, as smaller and lighter semiconductor wafers become commercially available the mass changes caused by processing of the semiconductor wafers will decrease, and higher accuracy measurements than can be achieved with the conventional methods and devices will be required to monitor the processing and/or to check the subsequent semiconductor wafers.

Therefore, there exists a problem of measuring the mass or the change in mass of a semiconductor wafer with greater accuracy.

SUMMARY OF THE INVENTION

The present invention aims to address the problem of increasing the accuracy with which the mass or the change in mass of a semiconductor wafer can be determined.

At its most general, the present invention relates to determining information relating to the mass of a semiconductor wafer by measuring only a difference between the weight of the semiconductor wafer and another predetermined weight. This contrasts with conventional balances, which directly measure the total (i.e. absolute) weight of the semiconductor wafer. The difference between the weight of the semiconductor wafer and the predetermined weight is smaller than the total weight of the semiconductor wafer, and can therefore be measured with a higher accuracy and/or resolution.

According to a first aspect of the present invention, there is provided a method of determining information relating to the mass of a semiconductor wafer comprising: loading the semiconductor wafer on to a measurement area of a weighing device having weight compensation means arranged to compensate for a predetermined weight loaded on to the measurement area; generating measurement output indicative of a difference between the weight of the semiconductor wafer and the predetermined weight; and using the measurement output to determine information relating to the mass of the semiconductor wafer.

In other words, the compensation means may be arranged to fully compensate for any weight loaded onto the measurement area that is less than, or equal to, the predetermined weight and to partially compensate (i.e. to compensate for part of the weight up to the predetermined weight) for any weight loaded on to the measurement area that is greater than the predetermined weight.

Compensating for weight loaded on to the measurement area may mean supporting, counteracting, counterbalancing or otherwise neutralising that weight, e.g. so that weight has no influence on the measurement output.

With the method of the present invention, the generated measurement output is indicative of a difference between the weight of the semiconductor wafer and the predetermined weight. For example, the generated measurement output may be indicative of an amount by which the weight of the semiconductor wafer exceeds the predetermined weight, or an amount by which the predetermined weight exceeds the weight of the semiconductor wafer. The difference between the weight of the semiconductor wafer and the predetermined weight is a smaller value than the total weight of the semiconductor wafer (which is measured by a conventional balance), and can therefore be measured with a greater accuracy/precision). For example, in embodiments of the present invention it may be possible to measure a mass or a change in mass of a semiconductor wafer to an accuracy of the order of ±10 μg or less, or even to an accuracy of the order of ±1 μg. This represents a 10 times or 100 times increase in the accuracy relative to the accuracy of the conventional methods for determining a mass or a change in mass of a semiconductor wafer (which may be of the order of ±100 μg).

For fixed relative measurement errors (e.g. a relative measurement error of 5%), the absolute value of the measurement error will be larger when measuring a larger value (e.g. the total weight of the semiconductor wafer) than when measuring a smaller value (e.g. the difference between the weight of the semiconductor wafer and the predetermined weight). Therefore, the absolute measurement error may be smaller with the present invention.

A weighing device with a smaller range of measurement outputs may be used in the method of the present invention, because the range of measurement outputs may only need to cover a suitable range of possible differences between the weight of the semiconductor wafer and the predetermined weight. In contrast, with a conventional balance the range of measurement outputs ranges from a minimum of zero up to a suitable maximum value that is equal to or greater than the largest possible weight of semiconductor wafer that the balance will be used with. Where the measurement output is generated using, for example, an analogue-to-digital (A/D) converter having a fixed number of quantisation levels, the resolution will be significantly greater and the quantisation error will be significantly smaller when using the A/D converter with a smaller range of measurement outputs, as may be the case with the method of the present invention.

Therefore, with the method of the present invention information relating to the mass of a semiconductor wafer can be determined with greater accuracy/precision than is possible with a conventional balance.

The method according to the first aspect of the present invention may have any one, or, to the extent that they are compatible, any combination of the following optional features.

The weight compensation means may be arranged to compensate for part of the weight of the semiconductor wafer; and the measurement output may be indicative of an amount by which the weight of the semiconductor wafer exceeds the compensated part of the weight of the semiconductor wafer. In other words, the predetermined weight may be less than the weight of the semiconductor wafer, so that the compensation means compensates for only a part of the weight of the semiconductor wafer. The amount by which the weight of the semiconductor wafer exceeds the compensated part of the weight of the semiconductor wafer is a smaller value than the total weight of the semiconductor wafer and can therefore be measured with a higher accuracy (as discussed above).

The weighing device may comprise a pre-loaded weighing device; and the measurement output may be indicative of a difference between the weight force of the semiconductor wafer and the pre-loading force. Therefore, the weight compensation means may comprise pre-loading the weighing device with a pre-loading force capable of compensating for (e.g. capable of supporting) a predetermined weight loaded on to the measurement area. The pre-loading force may compensate for part of the weight force of the semiconductor wafer. In other words, the pre-loading force may effectively cancel out or compensate for some of the weight of the semiconductor wafer, so that the measurement output only relates to the amount by which the weight force of the semiconductor wafer exceeds the pre-loading force. This is in contrast to conventional balances, where the measurement output relates to the total weight force of the semiconductor wafer. In some embodiments of the present invention, the weighing device may generate measurement output based on a measurement of an amount of electromagnetic force compensation required to compensate for (or counterbalance) the difference between the weight force of the semiconductor wafer and the pre-loading force. As a smaller electromagnetic force may be required in the method of the present invention (than would be required if the whole of the weight force of the semiconductor wafer was compensated for by the electromagnetic force compensation), a lower power and therefore more energy efficient (due to reduced thermal losses) electromagnetic force compensation arrangement may be used in the present invention. The electromagnetic force compensation arrangement (e.g. an electromagnetic coil) may also be smaller and lighter than would be required in a conventional balance.

The measurement output may be used to determine the mass of the semiconductor wafer. In other words, the method may be a method of determining the mass of a semiconductor wafer. Determining the mass (i.e. the total or absolute mass) of a semiconductor wafer may be useful for a number of different purposes such as quality control (or monitoring) of semiconductor wafer manufacture or processing, semiconductor wafer identification, etc.

The method may further comprise loading a reference mass on to the measurement area of the weighing device; and generating measurement output indicative of a difference between the weight of the reference mass and the predetermined weight. Therefore, the method may involve generating a first measurement output for the semiconductor wafer and a second measurement output for a reference mass. Essentially, a reference mass may be any mass. The measurement output for the reference mass may represent a baseline or reference result to which the measurement output for the semiconductor wafer can be compared, in order to determine information relating to the mass of the semiconductor wafer. The mass of the reference mass may be known to a high degree of accuracy. However, it is not essential for the mass of the reference mass to be known, for example where only a change in the mass of the semiconductor wafer is to be determined rather than its absolute mass.

The method may comprise using the known (e.g. measured) mass of the reference mass and the measurement outputs for the semiconductor wafer and for the reference mass to determine the mass of the semiconductor wafer. Determining the mass of the semiconductor wafer may comprise firstly determining a mass difference between the semiconductor wafer and the reference mass based on the measurement outputs for the semiconductor wafer and the reference mass. Then, the mass of the semiconductor wafer may be determined based on the determined mass difference and on the known (e.g. measured or predetermined) mass of the reference mass.

The method may comprise monitoring an evolution of the measurement output for the reference mass over time, e.g. by generating different measurement outputs for the reference mass at different times. The measurement output for the reference mass may vary over time due to changes in the temperature of the air in the device (and therefore changes in the air density and the air buoyancy force), or due to changes in the temperature of the device itself (e.g. thermal expansion of a part of the device or thermal drift in an electronic part of the device such as an amplifier), or due to changes in other parameters or variables such changes in the air pressure or vibration of the device. Ideally, therefore, the measurement outputs for the reference mass and for the semiconductor wafer would be generated at the same time, so that there are no changes in any of the parameters or variables between the measurements. However, this may not be possible with a single weighing device. Therefore, in practice the measurement output for the reference mass will be generated at a different time from the measurement output for the semiconductor wafer. If the measurement times are close together in time, any changes in the parameters or variables may be negligible. If there is a larger difference in time (e.g. a difference in time of the order of a minute, or of the order of tens or minutes) changes in the parameters or variables may be more significant. By monitoring the evolution of the measurement output for the reference mass over time, it may be possible to calculate or to estimate what the measurement output for the reference mass would have been if it was generated at the same time as the measurement output for the semiconductor wafer. Alternatively, or in addition, the method may comprise monitoring an evolution of the measurement output for the semiconductor wafer over time.

The method may comprise performing a measurement on the semiconductor wafer at a time $t=t_W$, performing one or more measurements on the reference mass at a time or times other than $t=t_W$, and calculating an estimate of a measurement on the reference mass at the time $t=t_W$ based on the one or more measurements performed on the reference mass at the time or times other than $t=t_W$. Therefore, the measurement output that would have been generated for the reference mass at the time $t=t_W$ can be calculated or estimated by extrapolating from, or interpolating between, the one or more measurement outputs generated for the reference mass at the time or times other that $t=t_W$. Preferably, more than one measurement will be performed on the reference mass and preferably at least one measurement will be before $t=t_W$ and at least one measurement will be after $t=t_W$.

The method may comprise determining the mass of the semiconductor wafer based on the measurement output and on the known compensated part of the weight of the semiconductor wafer (i.e. the known amount or extent of weight compensation provided by the weight compensation means). In other words, the total (i.e. absolute) mass of the semiconductor wafer may be determined by first determining the difference between the weight of the semiconductor wafer and the predetermined weight (e.g. the amount by which the weight of the semiconductor wafer exceeds the known compensated part of the weight of the semiconductor wafer) and then adding this difference to the known predetermined weight.

The weighing device may be pre-loaded by a reference mass. Essentially, a reference mass may be any mass. The reference mass may have a known (i.e. measured or predetermined) mass, but this is not essential.

The method may comprise determining the mass of the semiconductor wafer based on the measurement output and on the known mass of the reference mass. For example, the method may comprise firstly determining a mass difference between the semiconductor wafer and the reference mass based on the measurement output for the semiconductor wafer. Then, the total mass of the semiconductor wafer may be determined by adding this mass difference to the known (i.e. measured or predetermined) mass of the reference mass.

The method may comprise carrying out a measurement on the semiconductor wafer after the semiconductor wafer has been processed and wherein the measurement output is used to determine a change in the mass of the semiconductor wafer caused by the processing. Determining a change in mass of a semiconductor wafer caused by processing may facilitate or enable monitoring of wafer processing, for example in a wafer processing production line. For example, determining a change in the mass of the semiconductor wafer after processing may enable a determination about whether the processing has been correctly carried out and/or whether the semiconductor wafer has the desired properties and/or structure after the processing.

The method may further comprise carrying out a measurement on the semiconductor wafer before it has been processed and the measurement outputs from the before and after measurements may be used to determine the change in the mass of the semiconductor wafer caused by the processing. Therefore, the change in mass of the semiconductor wafer caused by processing may be determined by comparing measurement outputs generated for the semiconductor wafer before and after the processing. Measurements may also be performed on a reference mass before and after the processing.

The weighing device may comprise a balance having a counterweight arranged to pre-load the balance. In other words, the balance may have a weight on an opposite side of a pivot point or point of flexure to a side on which the weight of the semiconductor wafer is applied. Therefore, the weight of the counterweight may act to counterbalance or compensate for a predetermined weight loaded on the measurement area (e.g. to counterbalance for part of the weight of the semiconductor wafer).

The weight compensation means may compensate for at least 80%, or at least 90%, or at least 95% of the weight of the semiconductor wafer. Therefore, the method may comprise generating measurement output indicative of at most 20%, or at most 10%, or at most 5% of the weight of the semiconductor wafer. The measurement output may therefore relate to (i.e. correspond to or be proportional to) a small range of the weight of the semiconductor wafer. For example, the measurement output may correspond to 30%, or 20%, or 10% or less than 10% of the weight of the semiconductor wafer. As such, the measurement output may be more accurate and/or have a higher resolution than is possible when the measurement output relates to a weighing range with a larger size, e.g. a weighing range from 0 to $W_{MAX}$, where $W_{MAX}$ is greater than the weight of the semiconductor wafer.

The semiconductor wafer may be one of a plurality of semiconductor wafers having weights within a weight range, and a weighing range of the weighing device may be set based on the weight range. For example, where the semiconductor wafer is one of a plurality of semiconductor wafers passing along a production line comprising one or more wafer processing steps, the weighing range of the weighing device may be set based on an expected range of weights of the semiconductor wafers that have passed along the production line. For example, for the most accurate measurements the weighing range of the weighing device may be set to be the same as the expected range of weights of the semiconductor wafers that have passed along the production line. As discussed above, the weighing range of the weighing device may be the range of semiconductor wafers with which the weighing device can be used, e.g. to generate meaningful measurement output.

The density of the reference mass may be within ±20%, or within ±10%, or within ±5% of the density of a semiconductor substrate of the semiconductor wafer. Ideally, the density of the reference mass is the same as the density of the semiconductor wafer. In this case, the reference mass and the semiconductor wafer may experience the same air buoyancy forces, and therefore any errors normally caused by differences in air buoyancy forces may be avoided. At the high levels of measurement accuracy achievable with the method of the present invention, errors caused by differences in air buoyancy forces may become limiting errors. One option for dealing with such errors is to use more precise, and therefore more expensive, measurement devices to measure temperature, pressure etc. to try to calculate the air buoyancy forces, and therefore correct for any differences in the air buoyancy forces. However, by making the reference mass and the semiconductor wafer have the same or similar densities, the magnitude of the errors caused by differences in air buoyancy forces may be reduced to such a degree that the accuracy and resolution of conventional, cheaper sensors may still be sufficient, or to such a degree that it is unnecessary to measure or to try to correct for atmospheric buoyancy effects.

The reference mass may be made of the same material as a semiconductor substrate of the semiconductor wafer. For example, where the semiconductor wafer has a silicon substrate, the reference mass may be made of silicon. Therefore, the reference mass may have the same or similar properties as the semiconductor wafer and may be affected in the same way by changes in air density, temperature, etc.

In fact, the reference mass may be a semiconductor wafer. For example, the reference mass may be a semiconductor wafer from the same batch, manufacturing run, etc. as the semiconductor wafer being measured. The reference mass may have the same, or similar, configuration and structure to the semiconductor wafer being measured. For example, it may have been processed in the same way.

The reference mass may comprise a first material having a first density and a second material having a second density, and the combined density of the reference mass may be chosen based on the density of a semiconductor substrate of the semiconductor wafer. Alternatively, the density of the reference mass may be chosen based on a different density, for example a composite density of the semiconductor wafer. For example, the reference mass may comprise a first amount of a first material having a first density less than the density of the desired density (e.g. the density of the semiconductor substrate) and a second amount of a second material having a second density greater than the desired density, the first and second amounts and the first and second densities being selected so that the reference mass has the same composite/overall density as the desired density. Therefore, the reference mass may have an overall density that is the same as a semiconductor material without being made from that semiconductor material. This may reduce the cost of the reference mass.

A correction may be made for the buoyancy exerted on the semiconductor wafer by the atmosphere. Correcting for buoyancy effects may increase the accuracy of the measurements yet further.

A correction may be made for the buoyancy exerted on part of the weighing device by the atmosphere. Changes in the buoyancy force exerted on different parts of the weighing device (i.e. other than the reference mass, for example a part of a balance arm) may also affect the accuracy of the measurements. Therefore, the accuracy of the measurements may be increased by correcting for buoyancy or changes in buoyancy. For example, a correction may be made for changes in buoyancy exerted on part of the weighing device occurring between a measurement on a reference mass and a measurement on the semiconductor wafer.

The method may comprise calibrating the weighing device based on the measurement outputs for two known masses. In a conventional balance, calibration of the measurement output may be carried out based on a single measurement output for a known mass and on a zero value. In the method of the present invention, the weighing range does not include zero, and therefore it may be necessary to generate measurement outputs for two different masses of known (i.e. measured or predetermined) mass in order to calibrate the measurement output of the weighing device. Of course, the weighing device may be calibrated based on the measurement outputs for more than two known masses. Preferably, there is a relatively large (relative to the size of the weighing range) difference in weight between the two masses. For example, one mass may weighing range of the weighing device and another mass may have a weight close to (but below) the upper limit of the weighing range. As discussed above, the lower limit of the weighing range may be the maximum weight that the weight compensation means is able to fully compensate for, e.g. the weight at which the measurement output corresponds to zero weight. The upper limit of the weighing range may be a limitation of the weighing device, i.e. the weight that corresponds to the maximum possible measurement output of the weighing device.

The weighing device used in the method of the present invention may be considered as having a weighing range with a lower limit that is greater than zero weight, e.g. a weighing range that does not cover zero weight. The weighing range of the weighing device may be the range of input/applied weights (i.e. the weight loaded onto the measurement area of the weighing device) with which the weighing device can be used, for example the range of input/applied weights for which the weighing device generates meaningful measurement output. For example, if the weighing device only outputs meaningful measurement output for semiconductor wafers weighing between 120 g and 150 g, the weighing device may be said to have a weighing range of 120 g to 150 g and a lower limit of the weighing range of 120 g. A lower limit of the weighing range may be the largest weight that the weight compensation means can fully compensate. An upper limit of the weighing range may be the weight corresponding to the maximum possible measurement output of the weighing device.

For a conventional balance, the weighing range extends from a lower limit of zero weight to a predetermined maximum weight limit, $W_{MAX}$. In contrast, the weighing range of the weighing device used in the method of the present invention may go from a non-zero lower limit $W_{MIN}$ to a maximum limit $W_{MAX}$. Thus, with the method of the present invention the weighing range of the weighing device may be restricted (smaller) relative to the weighing range of a conventional balance.

Indeed, in a different example of the present invention there may be a method of determining information relating to the mass of a semiconductor wafer comprising: loading the semiconductor wafer on to a measurement area of a weighing device having a weighing range with a lower limit that is greater than zero, generating measurement output indicative of an amount by which the weight of the semiconductor wafer exceeds the lower limit of the weighing range; and using the measurement output to determine information relating to the mass of the semiconductor wafer.

According to a second aspect of the present invention there is provided a weighing device for determining information relating to the mass of a semiconductor wafer, the weighing device comprising: a support for loading the semiconductor wafer on to; weight compensation means arranged to compensate for a predetermined weight loaded on to the support; measurement means arranged to generate measurement output indicative of a difference between the weight of the semiconductor wafer and the predetermined weight; a reference mass; and means for loading and unloading the reference mass on to the support.

With the weighing device of the present invention, the measurement device generates measurement output that is indicative of a difference between the weight of the semiconductor wafer and the predetermined weight. For example, the measurement output may relate to an amount by which the weight of the semiconductor wafer exceeds the predetermined weight, or an amount by which the predetermined weight exceeds the weight of the semiconductor wafer, rather than to the total weight of the semiconductor wafer (as in a conventional balance). As discussed above, the difference between the weight of the semiconductor wafer and the predetermined weight is a smaller value than the total weight of the semiconductor wafer and can therefore be measured with a greater accuracy/precision. Therefore, with the weighing device of the present invention information relating to the mass of a semiconductor wafer can be determined with greater accuracy/precision than is possible with a conventional balance.

The weighing device of the present invention has a reference mass and means for loading and unloading the reference mass on to the support, for generating measurement output for the reference mass. Therefore, the weighing device is usable to generate first measurement output for a semiconductor wafer and second measurement output for the reference mass. As discussed above, information relating to the mass of the semiconductor wafer may be determined based on the measurement outputs for the semiconductor wafer and the reference mass.

The weighing device according to the second aspect of the present invention may have any one, or, to the extent that they are compatible, any combination of the following optional features.

The weight compensation means may be arranged to compensate for part of the weight of the semiconductor wafer; and the measurement means may be arranged to generate measurement output indicative of an amount by which the weight of the semiconductor wafer exceeds the compensated part of the weight of the semiconductor wafer. In other words, the predetermined weight may be less than the weight of the semiconductor wafer, so that the weight compensation means is arranged to compensate for a part of the weight of the semiconductor wafer.

The weighing device may comprise pre-loading means for applying a pre-loading force to the measurement device; and the measurement device may be arranged to generate measurement output indicative of a difference between the weight of the semiconductor wafer and the pre-loading force. For example, where the pre-loading force is less than the weight of the semiconductor wafer, the measurement output may be indicative of an amount by which the weight of the semiconductor wafer exceeds the compensated part of the weight of the semiconductor wafer. Therefore, the weighing device may have a weighing range with a lower limit that is the weight of a semiconductor wafer for which the weight force of the semiconductor wafer equals the pre-loading force. In other words, the pre-loading force may effectively cancel out or compensate for some of the weight of the semiconductor wafer, so that the measurement output only relates to the amount by which the weight force of the semiconductor wafer exceeds the pre-loading force. This is in contrast to conventional balances where the measurement output relates to the total weight force of the semiconductor wafer, rather than to only a part of the weight force of the semiconductor wafer.

The reference mass may be a semiconductor wafer. As discussed above, this may mean that the reference mass has the same properties as the semiconductor wafer and is affected in the same way by changes in air pressure, temperature, etc.

The reference mass may be made of a semiconductor material, for example silicon. Which semiconductor material the reference mass is made of may depend on the intended application of the weighing device, for example what type of semiconductor wafers it will be used to measure.

The reference mass may comprise a first material having a first density and a second material having a second density. As discussed above, the amounts of the two materials and their densities may be chosen and selected so that the reference mass has a desired density, such as the density of a particular semiconductor material.

Of course, the weighing device may comprise more than one reference mass, and those reference masses may be made of different materials. For example, one of the reference masses may be made of a first semiconductor material for use with a first type of semiconductor wafer and another one of the reference masses may be made of a second semiconductor material for use with a second type of semiconductor wafer.

The weighing device may comprise a balance having a counterweight arranged to pre-load the measurement device. In other words, the balance may have a weight on an opposite side of a pivot point or point of flexure to a side on which the weight of the semiconductor wafer is applied. Therefore, the weight of the counterweight may act to counterbalance or compensate for a predetermined weight loaded on the support (e.g. a part of the weight of the semiconductor wafer). The weighing device may use electromagnetic force compensation to compensate for/counterbalance the weight of the semiconductor wafer that exceeds the compensated part of the weight of the semiconductor wafer. In the weighing device of the present invention a smaller electromagnetic compensation force may be required than in a conventional balance in which electromagnetic force compensation is used to compensate for/counterbalance the whole weight force of the semiconductor wafer. Therefore, in the weighing device of the present invention it may be possible to use a smaller, lighter and/or lower power electromagnetic compensation system than in a conventional balance.

The weight compensation means may be arranged to compensate for at least 80%, or at least 90%, or at least 95% of the weight force of the semiconductor wafer. As discussed above, compensating/counteracting a large proportion of the weight of the semiconductor wafer means that the measurement output relates to a smaller value and/or that the weighing device may have a significantly reduced measurement range, which may significantly increase the accuracy and/or resolution of the weighing device.

The support may have a wafer-receiving surface for loading the semiconductor wafer on to, and the support and/or the reference mass may be configured so that the reference mass can be loaded and/or unloaded onto the support without interfering with the wafer-receiving surface. Therefore, it may be possible to easily and quickly interchange loading a reference mass or loading a semiconductor wafer on the support. This may reduce the minimum possible time gap between performing a measurement on a semiconductor wafer and performing a measurement on a reference mass.

The reference mass may have a through-hole in which the support is received so that the reference mass is positioned around the support. For example, the weight of the reference mass may be supportable on one or more protrusions extending from a side of the support. The weighing device may also have means for displacing the reference mass along the support, between a position where its weight is loaded on to the support and a position where its weight is not loaded on to the support. The wafer-receiving surface of the support may be at an end of the support, e.g. at an upper end of the support. The reference mass may be a semiconductor wafer having a through-hole in which the support is received.

BRIEF DESCRIPTION OF THE DRAWINGS

Embodiments of the present invention will now be discussed, by way of example only, with reference to the accompanying Figures, in which.

DETAILED DESCRIPTION OF THE PREFERRED EMBODIMENTS AND FURTHER OPTIONAL FEATURES OF THE INVENTION

Figure 1:
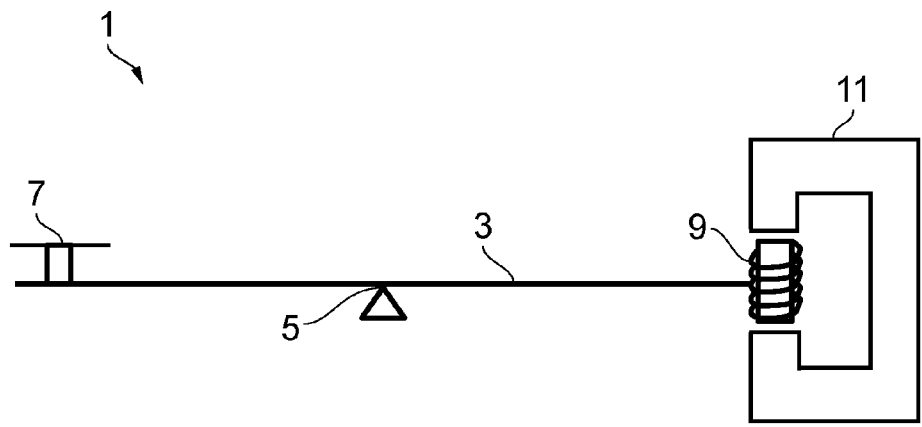
FIG. 1 is a schematic illustration of a conventional electronic balance.

FIG. 1 is a (simplified) schematic illustration of the principle components of a conventional electronic balance. As shown in FIG. 1, the conventional electronic balance 1 comprises a balance beam 3. The balance beam 3 can be pivoted at a pivot point 5, e.g. a knife edge. A balance pan 7 is positioned on the balance beam 3 on a first side of the pivot point 5. On a second side of the pivot point 5, an electromagnet 9 is positioned on the balance beam 3. The electromagnet 9 is located within the magnetic field of a magnet 11.

In use of the conventional electronic balance 1 an object whose weight is to be measured, for example a semiconductor wafer, is placed on the balance pan 7. The weight of the object on the balance pan 7 causes a moment of force on the balance beam 3 that acts to rotate the balance beam 3 in an anti-clockwise direction around the pivot point 5. Rotation of the balance beam 3 in an anti-clockwise direction around the pivot point 5 would cause the electromagnet 9 to move upwards.

When an electrical current is supplied to the electromagnet 9, the electromagnet 9 produces a magnetic field. The interaction between the magnetic field produced by the electromagnet 9 and the magnetic field produced by the magnet 11 causes the electromagnet 9 to experience a force, the magnitude and direction of which is determined by the magnitude and direction of the current applied to the electromagnet 9.

By applying a current with a suitable magnitude and direction to the electromagnet 9, the electromagnet 9 can be made to experience a downwards force which causes a moment of force on the balance beam 3 that is equal and opposite to the moment of force caused by the weight of the object on the balance pan 7 (i.e. a moment of force in the clockwise direction). In that case, the electromagnet 9 will stay stationary and will not move upwards, because the two moments of force acting on the balance beam cancel out, meaning that there is no resultant moment of force.

The downwards force on the electromagnet 9, and therefore the moment of force caused by the downwards force, depends on the magnitude of the current applied to the electromagnet 9. Therefore, the moment of force caused by the weight of the object on the balance pan 7 can be determined by measuring the magnitude of the current that needs to be supplied to the electromagnet 9 in order to keep the electromagnet 9 in the same position when the object is placed in the balance pan 7. The position of the electromagnet can be determined or directly measured with high precision using a photodiode and a light source (not shown), for example.

Figure 2:
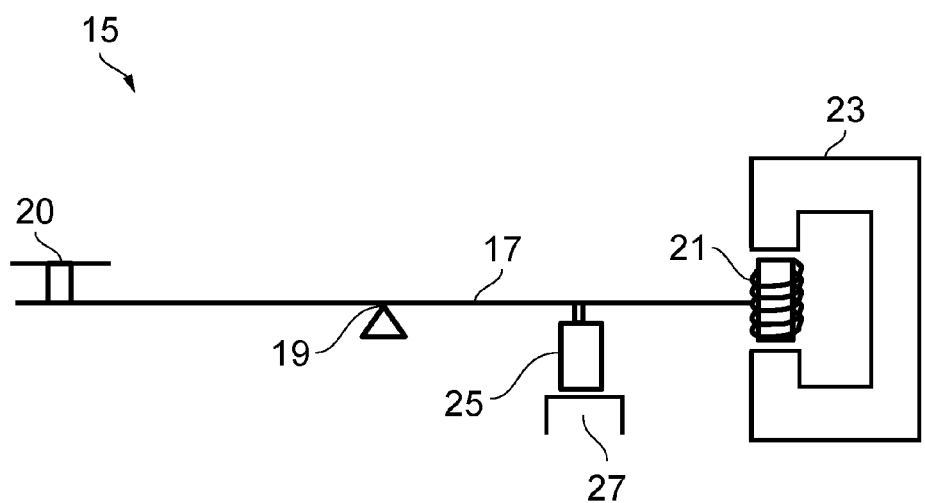
FIG. 2 is a schematic illustration of a weighing device that can be used in embodiments of the present invention.

FIG. 2 is a (simplified) schematic illustration of a weighing device that can be used in a method according to an embodiment of the present invention. As shown in FIG. 2, the weighing device 15 comprises a balance beam 17. The balance beam 17 can be pivoted at a pivot point 19. A balance pan 20 is positioned on the balance beam 17 on a first side of the pivot point 19. On a second side of the pivot point 19, an electromagnet 21 is positioned on the balance beam 17 (it is not essential for the electromagnet to be on the opposite side, in other embodiments it could be on the same side of the pivot point as the balance pan, provided that it is configured to provide a force in the appropriate direction). The electromagnet 21 is located within the magnetic field of a magnet 23. In addition, a counterweight 25 is attached to the balance beam 17 on the opposite side of the pivot point 19 to the balance pan 20. Beneath the counterweight 25 is an abutment surface 27 for limiting the extent of downwards movement of the counterweight 25.

In use, when no weight is present on the balance pan 20, the weight of the counterweight 25 is supported by the abutment surface 27. In this configuration, it is not necessary for the electromagnet 21 to provide any additional moment of force, so zero or a minimal current may be supplied to the electromagnet 21 and the electromagnet 21 may be at a zero or reference position relative to the permanent magnet 23.

When a weight is positioned on the balance pan 20, the weight force causes a moment of force on the balance beam 17. If this moment of force is less than the moment of force caused by the counterweight, the counterweight (or more correctly part of the weight of the counterweight) continues to be supported by the abutment surface 27 and the electromagnet 21 remains at the zero or reference position. In other words, the counterweight 25 acts as a weight compensation means that compensates for the weight on the balance pan 20. No additional current needs to be supplied to the electromagnet to keep it in its original position, and therefore the measurement output of the weighing device 15 stays the same, e.g. at a zero value. Thus, the weighing device 15 does not generate any meaningful measurement output. The weighing device 15 only generates meaningful measurement output when the weight on the balance pan 20 is greater than a lower weight limit (i.e. a weight threshold), at which the moment of force caused by the weight on the balance pan 20 is equal to the moment of force caused by the counterweight 25.

When a semiconductor wafer having a weight greater than the lower weight limit is positioned on the balance pan 20, part of the moment of force caused by the semiconductor wafer is compensated for (or counterbalanced) by the moment of force caused by the counterweight 25. In other words, the counterweight 25 acts as a weight compensation means that compensates for part of the weight of the semiconductor wafer. In order for the electromagnet 21 to remain in the zero or reference position, the remainder of the moment of force caused by the semiconductor wafer must be compensated for by a moment of force caused by a downwards force on the electromagnet 21. In order to provide the necessary downwards force on the electromagnet 21, a suitable current must be supplied to the electromagnet 21. By measuring the current (i.e. the magnitude) that is required to keep the electromagnet 21 in the zero or reference position, the moment of force caused by the electromagnet 21 that is necessary to keep the electromagnet 21 in the zero or reference position can be determined, and therefore the amount of the weight of the semiconductor wafer that is being compensated for/counterbalanced by the electromagnet 21 can be determined. In this manner, the weighing device 15 can be used to generate information indicative of an amount by which the weight of the semiconductor wafer exceeds the compensated part of the weight of the semiconductor wafer. In other words, the measurement output of the weighting device 15 only relates to a part of the weight of the semiconductor wafer above a threshold value.

The position of the electromagnet 21 can be measured accurately using conventional position measuring devices and techniques. For example, the position of the electromagnet 21 can be measured directly or indirectly using a light source and a photodiode.

In other embodiments the electromagnet 21 may be in a different position. For example, the electromagnet 21 may be on the same side of the pivot 19 as the balance pan 20 and arranged to provide an upwards force when the weight of the semiconductor wafer is greater than the predetermined weight.

In an alternative embodiment of the present invention, the counterweight 25 may be such (i.e. its weight and or position relative to the pivot point 19 may be such) that it compensates for a weight greater than the weight of the semiconductor wafer on the balance pan 20. In this case, when the semiconductor wafer is placed on the balance pan 20 the counterweight 25 remains in contact with the abutment surface 27 and applies a force to the abutment surface. By applying a current to the electromagnet 21 in an opposite direction to the previously described embodiment, the electromagnet can be made to experience an upwards force, which will provide an anti-clockwise moment around the pivot point 19 and act to lift the counterweight 25 from the abutment surface 27. By measuring the current that needs to be applied to the counterweight 25 to first lift the counterweight 25 off of the abutment surface 27 (or the maximum current at which the electromagnet 21 remains at the equilibrium position with the counterweight 25 in contact with the abutment surface 27), information indicative of the difference in weight between the semiconductor wafer and the counterweight 27 can be determined.

Essentially, a difference between the second embodiment and the first embodiment is that in the second embodiment the counterweight is arranged to compensate for a weight greater than the weight of the semiconductor wafer (e.g. 110% of the weight of the semiconductor wafer) whereas in the first embodiment the counterweight is arranged to compensate for a weight less than the weight of the semiconductor wafer (e.g. 90% of the weight of the semiconductor wafer). However, in both embodiments what is being measured is a difference in weight between the semiconductor wafer and the weight that the counterweight 25 is arranged to compensate for (i.e. maximum weight on the balance pan 20 that the counterweight 25 can compensate for).

Figure 3:
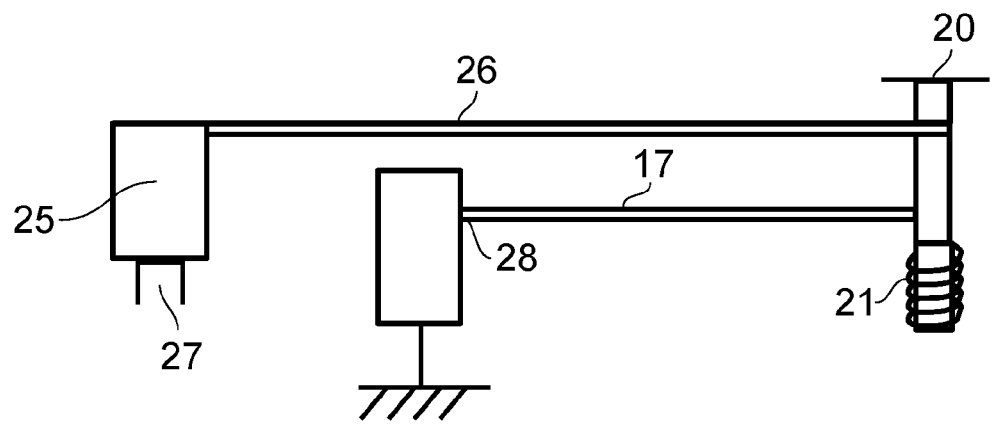
FIG. 3 is a schematic illustration of another weighing device that can be used in embodiments of the present invention.

FIG. 3 is a (simplified) schematic illustration of another weighing device that can be used in a method according to an embodiment of the present invention. In this weighing device the balance pan 20 is on a shaft that is connected to a fixed (i.e. rigid and stationary) body by a balance beam 17. The balance beam 17 is rigidly/solidly attached to the shaft at one of its ends and attached to the fixed body by a point of flexure 28 at the other of its end. The point of flexure is a point at which the balance beam 17 can flex and/or bend, e.g. in response to a load applied to the balance pan 20. Therefore, when a load is applied to the balance pan 20 the shaft can be displaced in a vertical direction by the balance beam 17 flexing or bending at the point of flexure 28. The shaft is also connected to a counterweight 25 by a rigid member 26 that is rigidly/solidly attached to the counterweight 25 and to the shaft. The counterweight 25 is positioned on an opposite side of the fixed body relative to the shaft, and therefore also on an opposite side of the point of flexure 28 relative to the shaft. An abutment surface 27 positioned beneath the counterweight 25 limits the vertical (i.e. downwards in FIG. 3) displacement of the counterweight 25. In this embodiment, the electromagnet 21 is positioned beneath the shaft. However, in other embodiments the electromagnet 21 may be positioned elsewhere. As with the previous embodiments, the electromagnet 21 is in a permanent magnetic field (not shown).

The weighing device according to this embodiment works in a similar way to the previous embodiment. The counterweight 25 provides a moment of force about the point of flexure 28 that can balance out a moment of force caused by a predetermined weight loaded on to the balance pan 20. In other words, the counterweight 25 is arranged to compensate for a predetermined weight loaded on to the balance pan 20. For example, the counterweight 25 may be arranged to compensate for part of the weight of a semiconductor wafer loaded on to the measurement pan 20. When a semiconductor wafer is loaded on the measurement pan 20 and its weight is greater than the predetermined weight, the balance beam 17 will flex or bend at the point of flexure 28, due to the resulting moment of force caused by the difference in weight between the semiconductor wafer and the predetermined weight, and the measurement pan 20 and shaft will move downwards.

However, if a suitable current is applied to the electromagnet 21 so that the electromagnet 21 experiences a suitable upwards force, this downward movement can be prevented. Therefore, the current that needs to be supplied to the electromagnet 21 to keep the measurement pan 20 in the same position when the semiconductor wafer is loaded on to the measurement pan 20 may be indicative of the difference in weight between the semiconductor wafer and the predetermined weight.

As above, in some embodiments the predetermined weight may be greater than the weight of the semiconductor wafer, in which case the electromagnet 21 will need to provide a downwards force on the shaft to cause the shaft to start to move downwards. The electromagnet 21 can be caused to provide such a downwards force by using a different direction current to the case where the electromagnet 21 needs to provide an upwards force.

Figure 4:
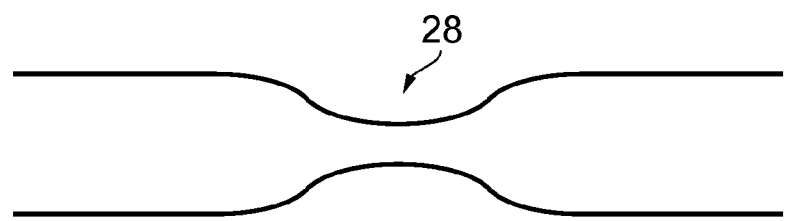
FIG. 4 is a schematic illustration of an example of the point of flexure in the weighing device of FIG. 3.

The point of flexure 28 may be as shown in FIG. 4, i.e. it may be a region of the balance beam 17 in which the width and/or thickness of the balance beam 17 is reduced, so that the balance beam 17 can more easily flex and/or bend at that point.

In embodiments of the present invention, an AC signal from the measurement of the current supplied to the electromagnet 21 may be converted into a DC signal by an AC to DC converter, as part of the measurement electronics of the weighing device 15.

In some embodiments of the present invention, the method may comprise choosing an appropriate moment of force to be caused by the counterweight 25, e.g. based on the fraction of the weight of the semiconductor wafer that it is desired to counterbalance, such as 80%, or 90% or 95%, and choosing an appropriate mass for the counterweight and/or an appropriate position for the counterweight on the balance beam to provide the appropriate moment of force. Therefore, the method may comprise changing the counterweight of the weighing device, and the weighing device may comprise a plurality of different counterweights that can be interchanged with each other when necessary.

In other embodiments of the present invention, the weighing device may not comprise a counterweight 25. In these embodiments, measurement output indicative of the difference between the weight of the semiconductor wafer and the predetermined weight may be generated by configuring the weighing device so that only a magnitude of a part of the current supplied to the electromagnet 21 that compensates for/counteracts the difference in weight is measured (directly or indirectly, e.g. by measuring a corresponding voltage). For example, measurement electronics of the weighing device may be arranged to accurately measure only a difference between the current supplied to the electromagnet 21 and a predetermined reference current (or a corresponding voltage difference). For example, the measurement electronics may be arranged to accurately measure only a part of the current supplied to the electromagnet 21 that is above a lower current limit. Essentially, in these embodiments the electromagnet 21 also acts as a weight compensation means that compensates for a predetermined weight loaded on the measurement area, so that the generated measurement output only relates to the difference between the weight of the semiconductor wafer and the predetermined weight.

Figure 5:
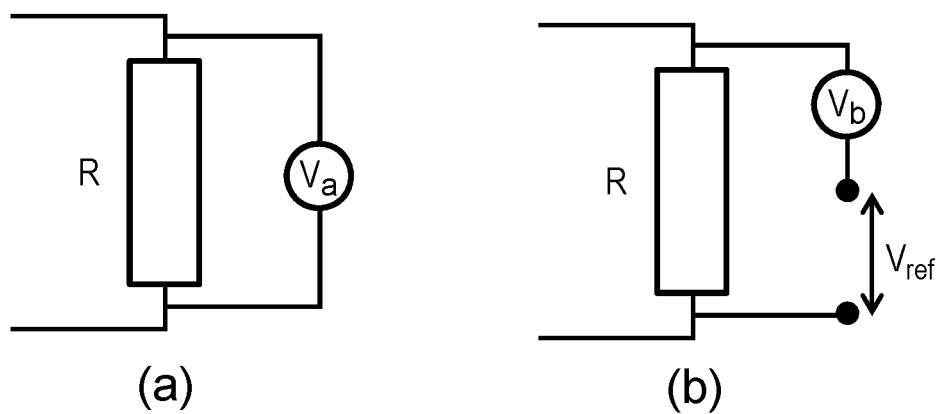
FIG. 5 is a schematic illustration of (a) the measuring electronics of a conventional weighing device, and (b) the measuring electronics of a weighing device according to an embodiment of the present invention.

An example of measurement electronics that might be used in the previously described embodiments are shown in FIG. 5(*a*). In this arrangement the current supplied to the electromagnet is passed through a resistor R and the voltage $V_a$ across the resistor is measured. This voltage is indicative of the current supplied to the electromagnet, and therefore indicative of the weight on the balance pan being supported by the electromagnet. An example of measurement electronics that might be used in the weighing device of this embodiment is shown in FIG. 5(*b*). In this arrangement, rather than measuring the whole voltage across the resistor R, only the voltage difference $V_b$ between the voltage across the resistor R and a predetermined reference voltage $V_{ref}$ is measured. Essentially, voltage $V_{ref}$ can be considered as relating to a part of the current supplied to the electromagnet that provides the weight compensation means, e.g. which causes the electromagnet to compensate for a predetermined weight on the measurement area. The measured voltage $V_b$ is indicative of the current supplied to the electromagnet to compensate for the weight of a semiconductor wafer in excess of the predetermined weight. For a given weight of semiconductor wafer the voltage $V_b$ will be a smaller value than the voltage $V_a$ and the measurement outputs for $V_b$ will fall within a smaller range of voltages (e.g. $V_{ref}$ to $V_{ref}+V_{b,max}$ rather than 0 to $V_{a,max}$). Where the measurement output is generated using an analogue-to-digital (A/D) converter having a fixed number of quantisation levels, the resolution will be significantly greater and the quantisation error will be significantly smaller when using the A/D converter with such a smaller range of measurement outputs.

As discussed above, measurements of a higher accuracy and/or resolution can be carried out with the method of the present invention. In particular, the difference between the weight of the semiconductor wafer and the predetermined weight is a smaller value than the total weight of the semiconductor wafer, and can therefore be determined with a higher accuracy and or resolution, e.g. using conventional detection electronics and systems.

In embodiments of the present invention, it may be possible to determine information relating to the mass of a semiconductor wafer to an accuracy of the order of 10 μg.

Figure 6:
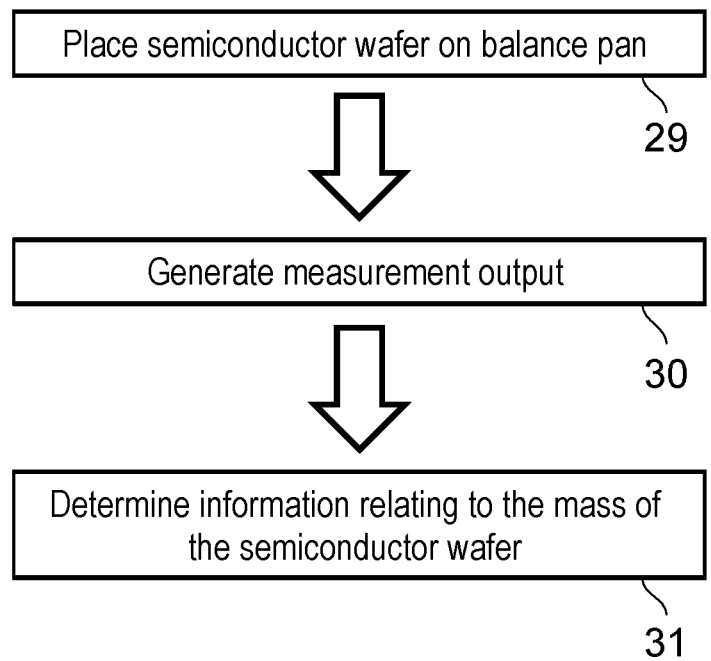
FIG. 6 is a flow chart setting out steps of a method according to a first embodiment of the present invention.

As illustrated in FIG. 6, in a first embodiment of the present invention the method comprises a first step 29 of placing a semiconductor wafer on the balance pan of the weighing device (e.g. the weighing device 15 illustrated in FIG. 2). Then, in a second step 30, the weighing device is used to generate measurement output that is indicative of an amount by which the weight of the semiconductor wafer exceeds the compensated part of the weight of the semiconductor wafer. As discussed above, this may involve measuring the current that needs to be supplied to the electromagnet of the weighing device in order to maintain the electromagnet in a zero or reference position. Then, in a third step 31, the measurement output is used to determine information relating to the mass of the semiconductor wafer. For example, the measurement output may be used to determine a mass of the semiconductor wafer, or a change in mass of the semiconductor wafer.

Of course, the method may comprise steps other than those specified in FIG. 6, either before, in-between or after the steps specified in FIG. 6.

In some embodiments of the present invention, the weight compensation means may be arranged to compensate for a weight loaded on to the measurement area that is greater than the weight of the semiconductor wafer, so that the measurement output is indicative of an amount by which the predetermined weight exceeds the weight of the semiconductor wafer. The other steps of the method may be the same.

In some embodiments of the present invention, the information relating to the mass of the semiconductor wafer may also be determined based on a known mass of the counterweight. For example, the method may comprise determining a difference in mass between the counterweight and the semiconductor wafer and may then further comprise determining the mass of the semiconductor wafer based on this difference and on the known mass of the semiconductor wafer.

Figure 7:
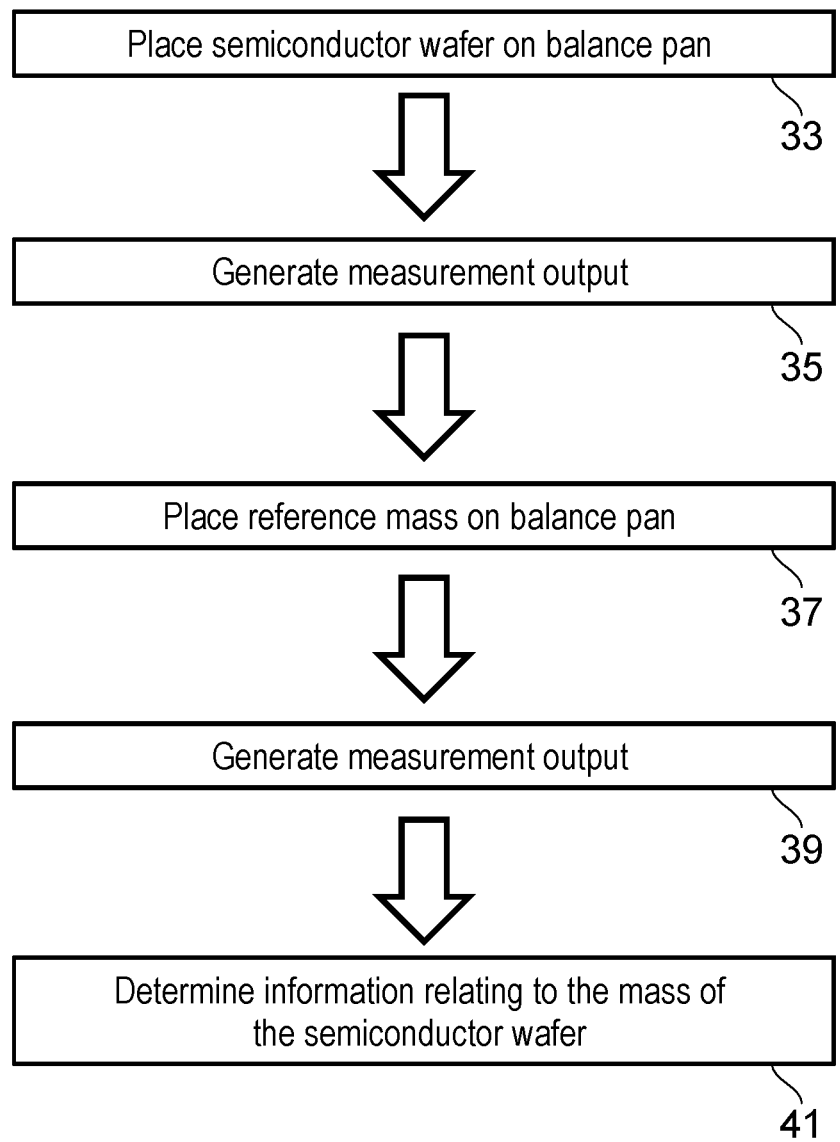
FIG. 7 is a flow chart setting out steps of a method according to a second embodiment of the present invention.

A method according to a second embodiment of the present invention is illustrated in FIG. 7. As with the first embodiment, the method comprises a first step 33 of placing a semiconductor wafer on the balance pan and a second step 35 of generating measurement output indicative of an amount by which the weight of the semiconductor wafer exceeds the compensated part of the weight of the semiconductor wafer. In addition, the method also comprises a third step 37 of placing a reference mass on the balance pan and a fourth step of generating measurement output indicative of an amount by which the weight of the reference mass exceeds the compensated part of the weight of the reference mass. In a fifth step 41, the method comprises using the measurement outputs for the reference mass and for the semiconductor wafer to determine information relating to the mass of the semiconductor wafer. For example, the method may comprise determining a difference in mass between the semiconductor wafer and the reference mass based on the measurement outputs for the semiconductor wafer and the reference mass. In addition, the method may comprise determining the mass of the semiconductor wafer based on this difference and on the known mass of the reference mass (which may be predetermined or previously or subsequently measured).

Of course, it is not essential in the method of FIG. 7 that the semiconductor wafer is measured before the reference mass. Instead, the reference mass may be measured before the semiconductor wafer. In addition, more than one measurement may be performed on the reference mass and/or more than one measurement may be performed on the semiconductor wafer, in any order.

In some embodiments of the present invention, the method may comprise performing a first measurement on the reference mass, then performing a measurement on the semiconductor wafer and then performing a second measurement on the reference mass. The method may also comprise estimating what the result of a measurement performed on the reference mass would have been at the time that the measurement was performed on the semiconductor wafer. For example, this may involve taking an average of the measurements performed on the reference mass, or interpolating between the measurements performed on the reference mass. This may help to avoid errors that would otherwise be caused by a change in the measurement environment between the measurement(s) on the reference mass and the measurement on the semiconductor wafer, such as a change in air density due to a change in temperature.

Figure 8:
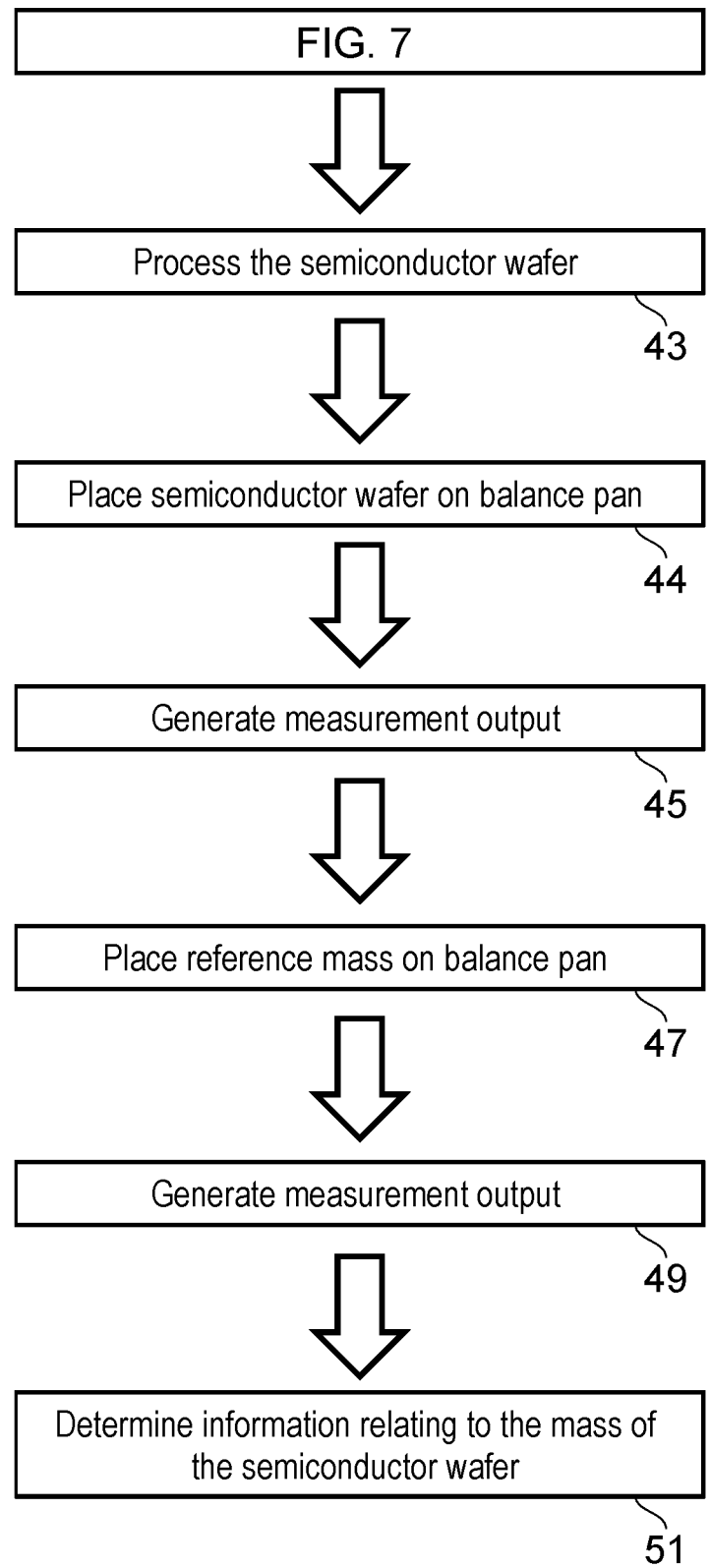
FIG. 8 is a flow chart setting out steps of a method according to a third embodiment of the present invention.

In a third embodiment of the present invention, as illustrated in FIG. 8, measurements may be performed on a reference mass and semiconductor wafer both before processing the semiconductor wafer and after processing the semiconductor wafer. As discussed above, based on the method of FIG. 7 the absolute mass of the semiconductor wafer and/or a difference in mass between the semiconductor wafer and the reference mass can be determined. Then, in step 43 the semiconductor wafer is processed. For example, a layer of material may be added to the semiconductor wafer or removed from the semiconductor wafer. The wafer processing may be carried out as part of a production line producing semiconductor devices. The processing of the semiconductor wafer will normally cause a change in mass of the semiconductor wafer. In steps 44 and 45 the semiconductor wafer is again placed on the balance pan and measurement output is generated that is indicative of an amount by which the weight of the semiconductor wafer exceeds the compensated part of the weight of the semiconductor wafer. In steps 47 and 49 the reference mass is then placed on the balance pan and measurement output is generated that is indicative of an amount by which the weight of the reference mass exceeds the compensated part of the weight of the reference mass. In step 51, information relating to the mass of the semiconductor wafer is determined based on the measurement outputs for the reference mass and semiconductor wafer. As with FIG. 7, the order in which the reference mass and semiconductor wafer are measured may be different to that shown in FIG. 8, and multiple measurements may be performed for the reference mass and/or for the semiconductor wafer before and/or after the processing.

Again, in alternative embodiments of FIGS. 7 and 8 the predetermined weight may be greater than the weight of the semiconductor wafer, so that the measurement output is indicative of an amount by which the predetermined weight exceeds the weight of the semiconductor wafer. The other steps in FIGS. 7 and 8 may be the same.

Following the method of FIG. 8 provides information both before and after the processing of the absolute mass of the semiconductor wafer and/or the difference in mass between the semiconductor wafer and the reference mass. Based on this information, a change in mass of the semiconductor wafer caused by the processing can be determined. This may enable/facilitate an assessment of whether or not the semiconductor wafer processing has been carried out correctly and/or whether or not the semiconductor wafer has the desired properties and/or structure following the semiconductor wafer processing.

In some embodiments of the present invention the method may be used to determine information relating to the mass of a semiconductor wafer with a diameter of 300 mm. The semiconductor wafers may have an average, or a nominal, mass of approximately 127 g, or approximately 130 g. In some embodiments of the present invention the weight compensation means may compensate for approximately 120 g and/or the weighing range of the weighing device may be approximately 30 g. A weighing range of approximately 30 g may be appropriate because the normal or average variation in mass of semiconductor wafers from some sources can be as much as 30 g. Where the present invention is used in the context of wafer processing, e.g. in a production line, the weighing range of the weighing device may be chosen to be the same as, or slightly larger than, an expected distribution in the weights of semiconductor wafers that have passed through the wafer processing. This may represent the highest accuracy that is possible while still being able to measure any of the wafers on the production line.

In embodiments where measurements are performed on a reference mass as well as on the semiconductor wafer, the reference mass may have the same or a similar density to the density of a semiconductor substrate of the semiconductor wafer, or to the overall density of the semiconductor wafer. This may reduce the effects of air buoyancy forces, and any changes in air buoyancy forces, on the measurements.

Indeed, in some embodiments the reference mass may be made of the same material as the semiconductor substrate, for example silicon, or in some embodiments the reference mass may be a semiconductor wafer similar to the semiconductor wafer being measured (e.g. from the same batch or source).

In alternative embodiments, the reference mass may be a composite reference mass made of more than one material of different densities. Thus, by combining different materials of different densities it may be possible to finely tune the composite density of the reference mass to any desired density, such as the density of the semiconductor substrate or the composite density of the semiconductor wafer.

The method may include correcting for buoyancy, or changes of buoyancy, acting on the reference mass, semiconductor wafer, or parts of the weighing device. For example, the weighing device may comprise one or more sensors for measuring one or more environmental conditions such as air pressure, air temperature, and relative humidity in order to calculate the air density and therefore the buoyancy force.

Figure 9:
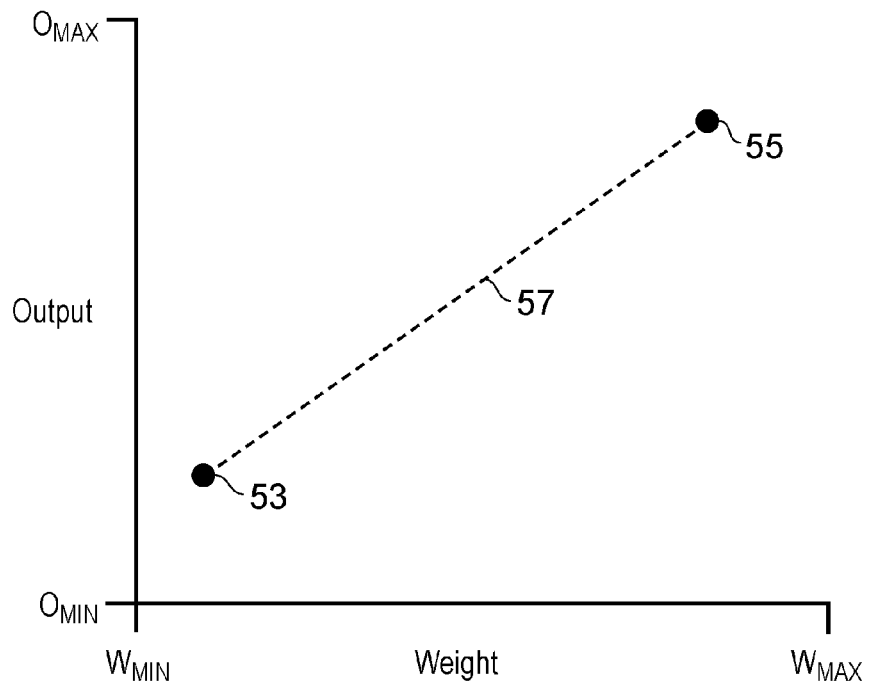
FIG. 9 is a schematic plot illustrating calibration of a weighing device that can be used in embodiments of the present invention.

Some embodiments of the present invention may comprise calibrating the measurement output of the weighing device. In particular, calibrating the measurement output of the weighing device may comprise determining a relationship between the measurement output of the weighing device and the amount by which the weight of the semiconductor wafer exceeds the compensated part of the weight of the semiconductor wafer. As illustrated in FIG. 9, calibration may comprise performing a first measurement 53 on a first mass of known weight and a second measurement 55 on a second mass of known weight. Assuming the weighing device has a linear response, which is normally true or a good approximation in practice, the weighing device can be calibrated by determining the equation and/or the gradient of the straight line 57 between the first 53 and second 55 measurements. Preferably, there is a relatively large difference between the masses of the first mass and the second mass, so that the first 53 and second 55 measurements span the whole weighing range. Of course, to improve the accuracy of the calibration more than two different masses may be used.

Figure 10:
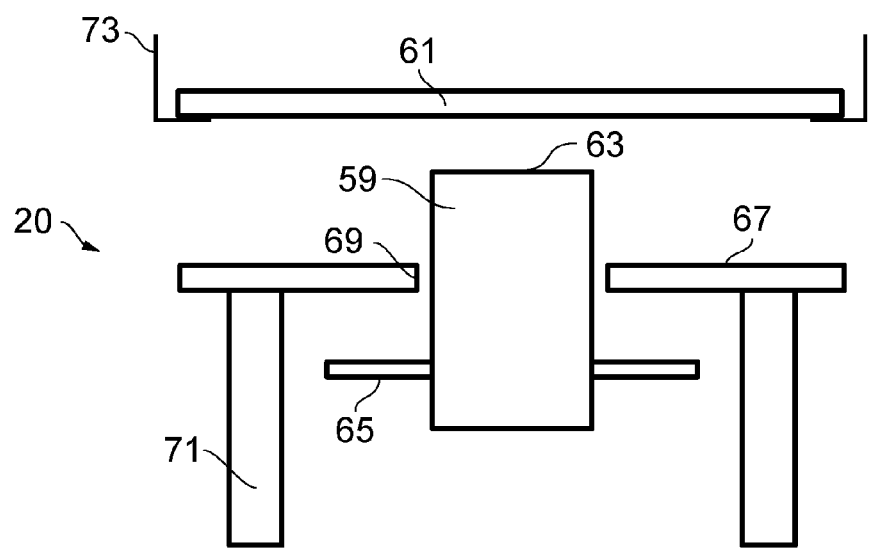
FIG. 10 is a schematic illustration of a balance pan of a weighing device according to an embodiment of the present invention.

FIG. 10 shows a balance pan 20 of a weighing device according to an embodiment of the present invention. The remainder of the weighing device may have a construction similar to that, or the same as that, illustrated schematically in FIG. 2 or 3.

The balance pan 20 comprises a support 59 for loading a semiconductor wafer 61 on to. The support 59 has a wafer receiving surface 63 at an upper end thereof for loading the semiconductor wafer 61 on to. The support 59 may be connected to a balance beam 17 so that a weight force applied to the support 59 causes a moment of force on the balance beam, as discussed above. The support 59 also has a reference mass support 65 for loading a reference mass 67 on to so that the weight of the reference mass 67 is supported by the support 59. For example, the reference mass support 65 may be a protruding rim that protrudes from, and surrounds, a perimeter of the support 59. Alternatively, the reference mass support 65 may comprise one or more protrusions that protrude from a side of the support 59. In this embodiment, the reference mass 67 comprises a disk shaped reference mass with a central through hole 69 in which the support 59 is received. For example, the reference mass 67 may comprise a semiconductor wafer, such as a silicon wafer, with a central through hole/opening 69.

The weighing device also comprises displacement means 71 which is operable to displace the reference mass 67 along the support 59. In particular, the displacement means 71 is operable to displace the reference mass 67 between a first position where it is in contact with the reference mass support 65 so that its weight is supported by the support 59 and a second position where it is not in contact with the reference mass support 65.

In use, when a measurement is to be performed on the semiconductor wafer 61, semiconductor wafer carrying means 73 is used to position the semiconductor wafer 61 on the wafer receiving surface 63 of the support 59, so that the weight of the semiconductor wafer 61 is supported by the support 59. At the same time, the reference mass 67 will be in a position where its weight is not supported by the support 59, i.e. it will have been displaced along the support 59 by the displacement means 71 so that it is not in contact with the reference mass support 65. Then, a measurement can be performed on the semiconductor wafer 61.

Subsequently, the semiconductor wafer 61 can be removed from the wafer receiving surface 63 of the support 59 by the semiconductor wafer carrying means 73 and the reference mass 67 can be brought into contact with the reference mass support 65 by the displacement means 71 so that its weight is supported by the support. Then a measurement can be performed on the reference mass 67. In this way, the reference mass 67 can be loaded and/or unloaded from the support 59 without interfering with the wafer receiving surface 63, so that measurements can be performed on the semiconductor wafer 61 and the reference mass 67 in quick succession.

Of course, the weighing device may include more than one reference mass 67, for example reference masses 67 made of different materials and/or reference masses with different masses.

The invention claimed is:

1. A method of determining information relating to the mass of a semiconductor wafer comprising:
   loading the semiconductor wafer on to a measurement area of a weighing device having weight compensation means arranged to compensate for a predetermined weight loaded on to the measurement area;
   loading a reference mass on to the measurement area of the weighing device;
   generating measurement output indicative of a difference between the weight of the semiconductor wafer and the predetermined weight; and using the measurement output to determine information relating to the mass of the semiconductor wafer;
wherein the density of the reference mass is within ±20%, or within ±10%, or within ±5% of the density of a semiconductor substrate of the semiconductor wafer.

2. The method according to claim 1, wherein:
the weight compensation means is arranged to compensate for part of the weight of the semiconductor wafer; and
the measurement output is indicative of an amount by which the weight of the semiconductor wafer exceeds the compensated part of the weight of the semiconductor wafer.

3. The method according to claim 1, wherein:
the weighing device comprises a pre-loaded weighing device; and
the measurement output is indicative of a difference between the weight force of the semiconductor wafer and the pre-loading force.

4. The method according to claim 3, wherein the weighing device is pre-loaded by a reference mass.

5. The method according to claim 4, wherein the method comprises determining the mass of the semiconductor wafer based on the measurement output and on the known mass of the reference mass.

6. The method according to claim 1, wherein the measurement output is used to determine the mass of the semiconductor wafer.

7. The method according to claim 1, wherein the method further comprises:
generating measurement output indicative of a difference between the weight of the reference mass and the predetermined weight.

8. The method according to claim 7, wherein the method comprises using the known mass of the reference mass and the measurement outputs for the semiconductor wafer and for the reference mass to determine the mass of the semiconductor wafer.

9. The method according to claim 7, wherein the method comprises monitoring an evolution of the measurement output for the reference mass over time.

10. The method according to claim 7, wherein the method comprises:
performing a measurement on the semiconductor wafer at a time $t=t_W$;
performing one or more measurements on the reference mass at a time or times other than $t=t_W$; and
calculating an estimate of a measurement on the reference mass at the time $t=t_W$ based on the one or more measurements on the reference mass at the time or times other than $t=t_W$.

11. The method according to claim 1, wherein the method comprises determining the mass of the semiconductor wafer based on the measurement output and on the known predetermined weight.

12. The method according to claim 1, wherein the method comprises carrying out a measurement on the semiconductor wafer after the semiconductor wafer has been processed and wherein the measurement output is used to determine a change in the mass of the semiconductor wafer caused by the processing.

13. The method according to claim 12, wherein the method further comprises carrying out a measurement on the semiconductor wafer before it has been processed and wherein the measurement outputs from the before and after measurements are used to determine the change in the mass of the semiconductor wafer caused by the processing.

14. The method according to claim 1, wherein the weighing device comprises a balance having a counterweight arranged to pre-load the balance.

15. The method according to claim 1, wherein the weight compensation means compensates for at least 80%, or at least 90%, or at least 95% of the weight of the semiconductor wafer.

16. The method according to claim 1, wherein:
the semiconductor wafer is one of a plurality of semiconductor wafers having weights within a weight range; and
a weighing range of the weighing device is set based on the weight range.

17. The method according to claim 1, wherein a correction is made for the buoyancy exerted on the semiconductor wafer by the atmosphere.

18. The method according to claim 1, wherein a correction is made for the buoyancy exerted on part of the weighing device by the atmosphere.

19. The method according to claim 1, wherein the method comprises calibrating the weighing device based on the measurement outputs for two known masses.

20. A method of determining information relating to the mass of a semiconductor wafer comprising:
loading the semiconductor wafer on to a measurement area of a weighing device having weight compensation means arranged to compensate for a predetermined weight loaded on to the measurement area;
loading a reference mass on to the measurement area of the weighing device;
generating measurement output indicative of a difference between the weight of the semiconductor wafer and the predetermined weight; and
using the measurement output to determine information relating to the mass of the semiconductor wafer;
wherein the reference mass is made of the same material as a semiconductor substrate of the semiconductor wafer.

21. A method of determining information relating to the mass of a semiconductor wafer comprising:
loading the semiconductor wafer on to a measurement area of a weighing device having weight compensation means arranged to compensate for a predetermined weight loaded on to the measurement area;
loading a reference mass on to the measurement area of the weighing device;
generating measurement output indicative of a difference between the weight of the semiconductor wafer and the predetermined weight; and
using the measurement output to determine information relating to the mass of the semiconductor wafer;
wherein the reference mass is a semiconductor wafer.

22. A method of determining information relating to the mass of a semiconductor wafer comprising:
loading the semiconductor wafer on to a measurement area of a weighing device having weight compensation means arranged to compensate for a predetermined weight loaded on to the measurement area;
loading a reference mass on to the measurement area of the weighing device;
generating measurement output indicative of a difference between the weight of the semiconductor wafer and the predetermined weight; and
using the measurement output to determine information relating to the mass of the semiconductor wafer; wherein:

the reference mass comprises a first material having a first density and a second material having a second density; and the combined density of the reference mass is chosen based on the density of a semiconductor substrate of the semiconductor wafer.

23. A weighing device for determining information relating to the mass of a semiconductor wafer, the weighing device comprising:

a support for loading the semiconductor wafer on to;

weight compensation means arranged to compensate for a predetermined weight loaded on to the support;

a measurement device arranged to generate measurement output indicative of a difference between the weight of the semiconductor wafer and the predetermined weight;

a reference mass; and the support including a reference mass support onto which the reference mass can be loaded and unloaded;

wherein the reference mass is a semiconductor wafer.

24. The weighing device according to claim 23, wherein:

the weight compensation means is arranged to compensate for part of the weight of the semiconductor wafer; and the measurement device is arranged to generate measurement output indicative of an amount by which the weight of the semiconductor wafer exceeds the compensated part of the weight of the semiconductor wafer.

25. The weighing device according to claim 23, wherein:

the weight compensation means comprises pre-loading means for applying a pre-loading force to the measurement device; and the measurement device is arranged to generate measurement output indicative of a difference between the weight of the semiconductor wafer and the pre-loading force.

26. The weighing device according to claim 23, wherein the weighing device comprises a balance having a counterweight arranged to pre-load the measurement device.

27. The weighing device according to claim 23, wherein the weight compensation means is arranged to compensate for at least 80%, or at least 90%, or at least 95% of the weight force of the semiconductor wafer.

28. The weighing device according to claim 23, wherein the support has a wafer-receiving surface for loading the semiconductor wafer onto and wherein the support and/or the reference mass are configured so that the reference mass can be loaded and unloaded onto the support without interfering with the wafer-receiving surface.

29. A weighing device for determining information relating to the mass of a semiconductor wafer, the weighing device comprising:

a support for loading the semiconductor wafer on to;

weight compensation means arranged to compensate for a predetermined weight loaded on to the support;

a measurement device arranged to generate measurement output indicative of a difference between the weight of the semiconductor wafer and the predetermined weight;

a reference mass; and the support including a reference mass support onto which the reference mass can be loaded and unloaded; wherein the reference mass is made of a semiconductor material.

30. A weighing device for determining information relating to the mass of a semiconductor wafer, the weighing device comprising:

a support for loading the semiconductor wafer on to;

weight compensation means arranged to compensate for a predetermined weight loaded on to the support;

a measurement device arranged to generate measurement output indicative of a difference between the weight of the semiconductor wafer and the predetermined weight;

a reference mass; and the support including a reference mass support onto which the reference mass can be loaded and unloaded; wherein the reference mass comprises a first material having a first density and a second material having a second density.

31. A weighing device for determining information relating to the mass of a semiconductor wafer, the weighing device comprising:

a support for loading the semiconductor wafer on to;

weight compensation means arranged to compensate for a predetermined weight loaded on to the support;

a measurement device arranged to generate measurement output indicative of a difference between the weight of the semiconductor wafer and the predetermined weight;

a reference mass; and the support including a reference mass support onto which the reference mass can be loaded and unloaded; wherein the reference mass has a through-hole in which the support is received so that the reference mass is positioned around the support.

* * * * *